United States Patent
Xia et al.

(10) Patent No.: US 9,528,774 B2
(45) Date of Patent: Dec. 27, 2016

(54) HEAT DISSIPATION APPARATUS AND CABINET BODY HAVING THE SAME

(71) Applicant: Huawei Technologies Co., Ltd., Shenzhen (CN)

(72) Inventors: Zaizhong Xia, Shanghai (CN); Wen Fang, Shanghai (CN); Yun Tang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/693,449

(22) Filed: Apr. 22, 2015

(65) Prior Publication Data

US 2015/0305195 A1   Oct. 22, 2015

(30) Foreign Application Priority Data

Apr. 22, 2014  (CN) .......................... 2014 1 0163227

(51) Int. Cl.
| | |
|---|---|
| *F28D 15/00* | (2006.01) |
| *F28F 3/02* | (2006.01) |
| *F28F 13/06* | (2006.01) |
| *F28D 9/00* | (2006.01) |
| *H05K 7/20* | (2006.01) |
| *H01L 23/367* | (2006.01) |
| *H01L 23/467* | (2006.01) |
| *H01L 23/473* | (2006.01) |

(52) U.S. Cl.
CPC .............. *F28F 3/02* (2013.01); *F28D 9/0068* (2013.01); *F28F 13/06* (2013.01); *H05K 7/206* (2013.01); *H01L 23/3672* (2013.01); *H01L 23/467* (2013.01); *H01L 23/473* (2013.01); *H01L 2924/0002* (2013.01)

(58) Field of Classification Search
CPC  H05K 7/20145; H05K 7/20154; H05K 7/206; H05K 7/20754; F28F 3/005; F24F 12/006; F28D 1/0308; F28D 1/0391; F28D 9/0037; F28D 9/0068; F28D 9/0093; F28D 9/02
USPC ...................................... 165/104.34, 54, 166
See application file for complete search history.

(56) References Cited

U.S. PATENT DOCUMENTS

| | | | | |
|---|---|---|---|---|
| 2,321,110 | A * | 6/1943 | Shipman | ............... F28D 9/0037 165/160 |
| 4,041,591 | A * | 8/1977 | Noll | ........................ B23P 15/26 138/115 |

(Continued)

FOREIGN PATENT DOCUMENTS

| | | |
|---|---|---|
| EP | 1901599 A1 | 3/2008 |
| WO | WO 2007121925 A1 | 11/2007 |

*Primary Examiner* — Travis Ruby
(74) *Attorney, Agent, or Firm* — Leydig, Voit & Mayer, Ltd.

(57) ABSTRACT

A heat dissipation apparatus including multiple heat exchange sheets. A first path and a second path are formed between the multiple heat exchange sheets, and the first path includes a first countercurrent channel, a guide channel, and a first-outlet cross-flow channel; the second path includes a second countercurrent channel and a second-inlet cross-flow channel. One part of a first fluid that enters the first path enters the first countercurrent channel and mainly performs countercurrent heat exchange with a second fluid that is in the second countercurrent channel, and the other part passes the guide channel and rapidly performs cross-flow heat exchange.

20 Claims, 7 Drawing Sheets

(56) References Cited

U.S. PATENT DOCUMENTS

| | | | | |
|---|---|---|---|---|
| 4,298,059 A | * | 11/1981 | Krauth | F28F 21/04 |
| | | | | 165/166 |
| 4,475,589 A | * | 10/1984 | Mizuno | F28F 3/083 |
| | | | | 165/166 |
| 5,915,469 A | * | 6/1999 | Abramzon | B64D 13/00 |
| | | | | 165/134.1 |
| 7,866,379 B2 | * | 1/2011 | Murayama | F28D 9/0037 |
| | | | | 165/166 |
| 8,376,036 B2 | | 2/2013 | Kammerzell | |
| 2003/0094006 A1 | * | 5/2003 | Des Champs | F24F 1/027 |
| | | | | 62/186 |
| 2006/0196649 A1 | * | 9/2006 | Shibata | F28D 9/0037 |
| | | | | 165/166 |
| 2010/0051248 A1 | * | 3/2010 | Inatomi | F28F 3/04 |
| | | | | 165/166 |
| 2010/0071887 A1 | * | 3/2010 | Sugiyama | F24F 12/006 |
| | | | | 165/166 |

* cited by examiner

HEAT DISSIPATION APPARATUS AND CABINET BODY HAVING THE SAME

CROSS-REFERENCE TO RELATED APPLICATION

This application claims priority to Chinese Patent Application No.201410163227.8, filed Apr. 22, 2014, which is hereby incorporated by reference in its entirety.

TECHNICAL FIELD

The present invention relates to the field of noise reduction, and in particular, to a heat dissipation apparatus and a cabinet body having the same.

BACKGROUND

With the improvement of a living standard and environmental awareness, people have increasingly high requirements on equipment noise, and equipment noise is not only a key condition of market access of a product, but also an important factor of competitive differentiation of the product.

As electronic devices (an IT device, a communications device, and the like) produce an increasing amount of heat, to ensure secure operation of a device, cooling based temperature control needs to be performed on the device. At present, a most common cooling manner is based on a heat exchanger. A common heat exchanger is mainly a plate heat exchanger, which includes a heat exchange core, necessary structural space, and a fan. The heat exchange core generally includes a series of heat exchange sheets, and an internal circulation airflow and an external circulation airflow are respectively on two sides of a heat exchange sheet. Generally, an internal circulation fluid has a high temperature, flows by one side of the heat exchange sheet, and transfers heat to the heat exchange sheet. The heat exchange sheet transfers, by conduction, the heat to the other side of the heat exchange sheet. An external circulation fluid, which is cold, flows by the heat exchange sheet and carries the heat away, so that a heat exchange function is implemented.

However, existing plate heat exchange has limited efficiency, and cannot meet an electronic device that produces an increasing amount of heat.

SUMMARY

Technical problems to be resolved by embodiments of the present invention are to provide a heat dissipation apparatus and a cabinet body having the same, so that heat exchange efficiency can be improved.

According to one aspect, a heat dissipation apparatus is provided, where the heat dissipation apparatus includes multiple heat exchange sheets, the multiple heat exchange sheets are successively arranged at intervals along a thickness direction of the heat exchange sheets, at least one first path and at least one second path are formed between the multiple heat exchange sheets, and the at least one first path and the at least one second path are respectively disposed on two sides of the heat exchange sheets, and by using the heat exchange sheets, the at least one first path and the at least one second path are isolated from each other and perform heat exchange; and the first path is configured to accommodate a first fluid, the second path is configured to accommodate a second fluid, and the first fluid and the second fluid are used to transfer heat by flowing; where the first path has a first inlet and a first outlet that are disposed opposite to each other, and the first path includes a first countercurrent channel, a guide channel, and a first-outlet cross-flow channel; two ends of the first countercurrent channel are respectively connected to the first inlet and the first outlet; the first countercurrent channel and the guide channel are disposed side by side, and the first countercurrent channel and the guide channel are isolated from each other by using a protruding isolation rib; and one end of the guide channel is connected to the first inlet, and the other end is connected to the first outlet by using the first-outlet cross-flow channel; and the second path has a second inlet and a second outlet that are disposed opposite to each other, the second path includes a second countercurrent channel and a second-inlet cross-flow channel; one end of the second countercurrent channel is connected to the second outlet and the other end is connected to the second inlet by using the second-inlet cross-flow channel; the first countercurrent channel and the second countercurrent channel are disposed opposite to each other, and the first countercurrent channel and the second countercurrent channel are parallel to each other, so that flow directions of the first fluid and the second fluid are opposite to each other, and countercurrent heat exchange is performed; the first-outlet cross-flow channel and the second-inlet cross-flow channel are disposed opposite to each other, and an extension direction of the first-outlet cross-flow channel and that of the second-inlet cross-flow channel intersect, so that the flow directions of the first fluid and the second fluid intersect, and cross-flow heat exchange is performed; and an isolation structure is disposed between the second path and a spatial region that is on the other side of the heat exchange sheet and is disposed opposite to the guide channel In a first possible implementation manner, in a case in which the number of the at least one first path or the number of the at least one second path is two or more, the number of the at least one first path and the number of the at least one second path are equal or have a difference of one, and the at least one first path and the at least one second path are alternately arranged along an arrangement direction of the multiple heat exchange sheets.

In a second possible implementation manner, a range of a distance between two heat exchange sheets that form the first path is 0.5 mm to 4 mm.

In a third possible implementation manner, a range of a distance between two heat exchange sheets that form the second path is 1 mm to 4 mm.

In a fourth possible implementation manner, a cross section of the first countercurrent channel is larger than a cross section of the guide channel In a fifth possible implementation manner, a cross section of the first-outlet cross-flow channel is larger than a cross section of the guide channel In a sixth possible implementation manner, one end of the protruding isolation rib extends to an outlet of the first path to isolate the first-outlet cross-flow channel from the first countercurrent channel; and the first countercurrent channel extends to the outlet of the first path.

In a seventh possible implementation manner, the extension direction of the second-inlet cross-flow channel and an extension direction of the second countercurrent channel are the same, and are both in a shape of a straight line; and the first-outlet cross-flow channel extends in a curved shape; or the first-outlet cross-flow channel and the second-inlet cross-flow channel both extend in a curved shape, and opening directions of an outlet of the first-outlet cross-flow channel and an inlet of the second-inlet cross-flow channel are opposite to each other.

In an eighth possible implementation manner, the isolation structure is a protruding block, and the isolation structure fills the spatial region that is on the other side of the heat exchange sheet and is disposed opposite to the guide channel; or the isolation structure is an annular protruding rib, and surrounds the spatial region that is on the other side of the heat exchange sheet and is disposed opposite to the guide channel.

With reference to any one of the forgoing implementation manners, in a ninth possible implementation manner, the first channel further includes a first-inlet cross-flow channel, and the guide channel and/or the first countercurrent channel is connected to the first inlet by using the first-inlet cross-flow channel; and the second path further includes a second-outlet cross-flow channel, the second countercurrent channel is connected to the second outlet by using the second-outlet cross-flow channel; and the second-outlet cross-flow channel and the first-inlet cross-flow channel are disposed opposite to each other, and an extension direction of the second-outlet cross-flow channel and that of the first-inlet cross-flow channel intersect, so that the flow directions of the first fluid and the second fluid intersect, and cross-flow heat exchange is performed.

With reference to the ninth possible implementation manner, in a tenth possible implementation manner, a cross section of the first-inlet cross-flow channel is larger than the cross section of the guide channel.

With reference to the ninth possible implementation manner, in an eleventh possible implementation manner, the first-inlet cross-flow channel extends in a curved shape, the second-outlet cross-flow channel extends in a curved shape, and opening directions of an inlet of the first-inlet cross-flow channel and an outlet of the second-outlet cross-flow channel are opposite to each other; or the first-inlet cross-flow channel extends in a curved shape, and the extension direction of the second-outlet cross-flow channel and that of the second countercurrent channel are the same, and are both in a shape of a straight line.

In a twelfth possible implementation manner, the multiple heat exchange sheets are divided into two categories: a first heat exchange sheet and a second heat exchange sheet; the protruding isolation rib is fastened on the first heat exchange sheet, the isolation structure is fastened on the second heat exchange sheet, and the protruding isolation rib and the isolation structure are respectively disposed on two sides of the first heat exchange sheet and the second heat exchange sheet; the first heat exchange sheet and the second heat exchange sheet are alternately arranged; and a first path is formed between the first heat exchange sheet and the second heat exchange sheet that is on one side of and adjacent to the first heat exchange sheet, and a second path is formed between the first heat exchange sheet and the second heat exchange sheet that is on the other side of and adjacent to the first heat exchange sheet; or the protruding isolation rib and the isolation structure are independent parts, and are clamped between the first heat exchange sheet and the second heat exchange sheet; or the multiple heat exchange sheets are divided into two categories: a third heat exchange sheet and a fourth heat exchange sheet; the third heat exchange sheet and the fourth heat exchange sheet are alternately arranged, and the protruding isolation rib and the isolation structure are respectively fastened on two sides of the third heat exchange sheet; the fourth heat exchange sheet is in a shape of a flat plate; a first path is formed between one fourth heat exchange sheet and one side, on which a protruding isolation bar is disposed, of the third heat exchange sheet; and a second path is formed between another fourth heat exchange sheet and one side, on which the isolation structure is disposed, of the third heat exchange sheet; or the heat exchange sheet includes a first heat exchange component and a second heat exchange component, the first heat exchange component and the second heat exchange component are both sheet-shaped, and the first heat exchange component and the second heat exchange component are fit and thermally coupled to each other; the protruding isolation bar is fastened on one side that is farther from the second heat exchange component and of the first heat exchange component, and the isolation structure is fastened on one side that is farther from the first heat exchange component and of the second heat exchange component; and structures of two adjacent heat exchange sheets are symmetrical to each other, protruding isolation ribs of the two adjacent heat exchange sheets can be fit to each other, and form the first path between the two adjacent heat exchange sheets; and isolation structures of another two adjacent heat exchange sheets can be fit to each other, and form the second path between the two adjacent heat exchange sheets.

In a thirteenth possible implementation manner, the first fluid is a liquid or a gas; and the second fluid is a liquid or a gas.

In a fourteenth possible implementation manner, a heat exchange sheet is a sheet metal component, and the protruding isolation rib and a first protruding edge rib are formed on the heat exchange sheet by stamping.

According to another aspect, a cabinet body is provided, where the cabinet body includes a main body of the cabinet body and the forgoing heat dissipation apparatus; and the heat dissipation apparatus is mounted on the main body of the cabinet body, and is configured to perform heat dissipation on elements inside the cabinet body;

a first path of the heat dissipation apparatus and an interior of the cabinet body are connected to form an internal circulation path, so that heat inside the cabinet body is transferred to heat exchange sheets of the heat dissipation apparatus; and correspondingly, a second path of the heat dissipation apparatus and an exterior of the cabinet body are connected to form an external circulation path, so that the heat on the heat exchange sheets is transferred out of the cabinet body; or a second path of the heat dissipation apparatus and an interior of the cabinet body are connected to form an internal circulation path, so that heat inside the cabinet body is transferred to heat exchange sheets of the heat dissipation apparatus; and correspondingly, a first path of the heat dissipation apparatus and an exterior of the cabinet body are connected to form an external circulation path, so that the heat on the heat exchange sheets is transferred out of the cabinet body.

According to the present invention, a heat dissipation apparatus and a cabinet body having the same are provided, and a first fluid that enters a first path can be divided into two parts: one part enters a first countercurrent channel and mainly performs countercurrent heat exchange with a second fluid in a second countercurrent channel, and the other part enters and passes a guide channel and is rapidly transferred to a first-outlet cross-flow channel that is located at an outlet of the first path, and performs cross-flow heat exchange with the second fluid in a second-inlet cross-flow channel; the second fluid in a second-inlet cross-flow channel does not perform heat exchange either, and a temperature difference between the first fluid in the first-outlet cross-flow channel and the second fluid in the second-inlet cross-flow channel is large, and a heat exchange effect is good, so that heat exchange efficiency can be improved; and the heat dissipation apparatus is capable of performing both cross-flow heat exchange and countercurrent heat exchange, and application of cross-flow heat exchange can achieve more effective heat exchange, thereby improving overall heat exchange efficiency.

BRIEF DESCRIPTION OF DRAWINGS

To describe the technical solutions in the present invention more clearly, the following briefly introduces the accompanying drawings required for describing the embodiments. Apparently, the accompanying drawings in the following description show merely some implementation manners of the present invention, and a person of ordinary skill in the art may still derive other drawings from these accompanying drawings without creative efforts.

DESCRIPTION OF EMBODIMENTS

The following clearly and describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Figure 1:
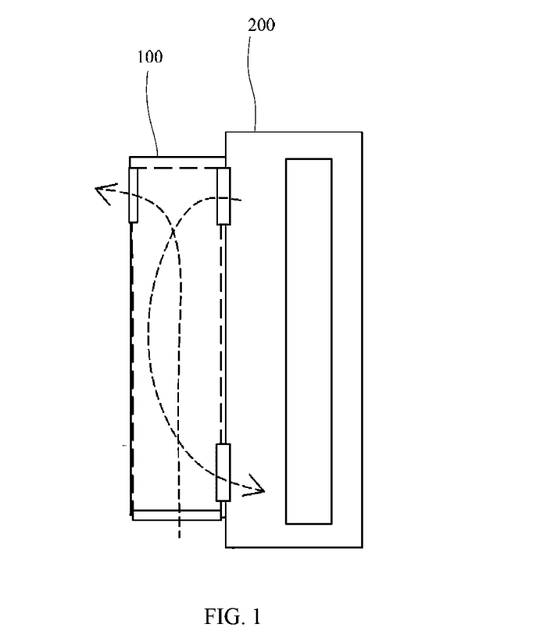
FIG. 1 is a schematic diagram of a cabinet body according to a first implementation manner of the present invention.

As shown in FIG. 1, the present invention provides a cabinet body, where the cabinet body includes a main body of the cabinet body 200 and a heat dissipation apparatus 100. The heat dissipation apparatus 100 is mounted on the main body of the cabinet body 200, and is configured to perform heat dissipation on elements inside the main body of the cabinet body 200. In this embodiment, the cabinet body is an outdoor communications device cabinet body, and the heat dissipation apparatus 100 is mounted on a side of the main body of the cabinet body 200. Definitely, in another implementation manner, the cabinet body may be an indoor communications device cabinet body, and the heat dissipation apparatus 100 may be mounted on a top of the main body of the cabinet body 200, or mounted on a door of the main body of the cabinet body 200.

Figure 5:
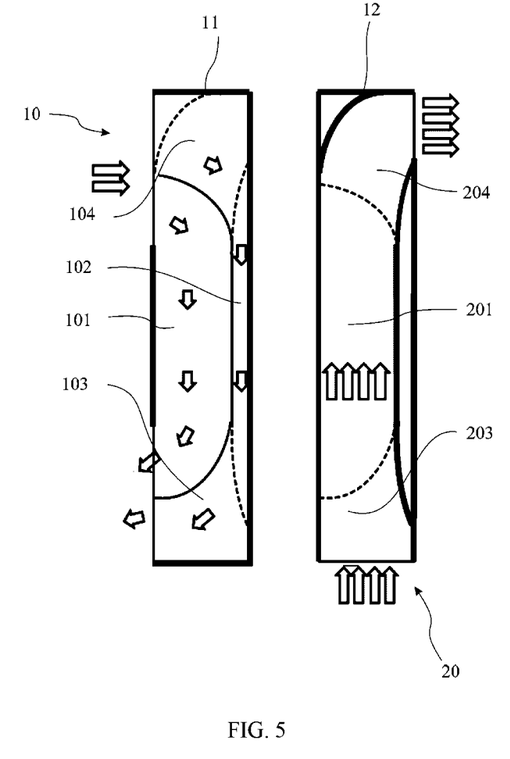
FIG. 5 is a schematic diagram of moving directions of a fluid on two sides of a heat exchange sheet in FIG. 2 when the heat exchange sheet exchanges heat.

As shown in FIG. 5, the heat dissipation apparatus 100 includes multiple heat exchange sheets 1, 2, and 3, and the multiple heat exchange sheets 1, 2, and 3 are successively arranged at intervals along a thickness direction of the heat exchange sheets; at least one first path 10 and at least one second path 20 are formed between the multiple heat exchange sheets 1, 2, and 3; the first path 10 and the second path 20 are respectively disposed on two sides of the heat exchange sheets, and by using the heat exchange sheets, the first path 10 and the second path 20 are isolated from each other and perform heat exchange. The first path 10 is configured to accommodate a first fluid, the second path 20 is configured to accommodate a second fluid, and the first fluid and the second fluid are used to transfer heat by flowing. In this embodiment, the number of the at least one first path 10 and the number of the at least one second path 20 are both multiple, and the at least one first path 10 and the at least one second path 20 are successively arranged alternately between the multiple heat exchange sheets 1, 2, and 3. The first path 10 and an interior of the cabinet body 200 are connected to form an internal circulation path, so that heat inside the cabinet body is transferred to the heat exchange sheets; and the second path 20 and an exterior of the cabinet body 200 are connected to form an external circulation path, so that the heat on the heat exchange sheets is transferred out of the cabinet body, and heat dissipation is performed on the interior of the cabinet body. The first fluid is a liquid or a gas, and the second fluid is a liquid or a gas.

Here, as another implementation manner, the number of the heat exchange sheets 1, 2, and 3 may be three, the number of the at least one first path 10 and the number of the at least one second path 20 are one, the two heat exchange sheets 1 and 3 form one first path 10, one second path 20 is formed between one heat exchange sheet 1 in the two heat exchange sheets 1 and 3, and the other heat exchange sheet 2, that is, the first path 10 and the second path 20 are respectively disposed on two sides of the heat exchange sheet 1 in the middle. It can be understood that, in a case in which the number of the at least one first path 10 or the number of the at least one second path 20 is two or more, the number of the at least one first path 10 and the number of the at least one second path 20 are equal or have a difference of one, and the at least one first path 10 and the at least one second path 20 are alternately arranged along an arrangement direction of the multiple heat exchange sheets, to perform heat exchange. Further, the first path 10 may be connected to an exterior of the cabinet body to form an external circulation path, so that external circulation is performed; and correspondingly, the second path 20 may be connected to an interior of the cabinet body to form an internal circulation path, so that internal circulation is performed.

A range of a distance between the two heat exchange sheets 1 and 3 that form the first path 10 is 0.5 mm to 4 mm, and a range of a distance between the two heat exchange sheets 1 and 2 that form the second path 20 is 1 mm to 4 mm, to ensure that an amount of a first fluid and an amount of a second fluid respectively pass the two paths, and the first fluid and the second fluid can fully contact the heat exchange sheets 1 and 2, to perform heat exchange.

Figure 3:
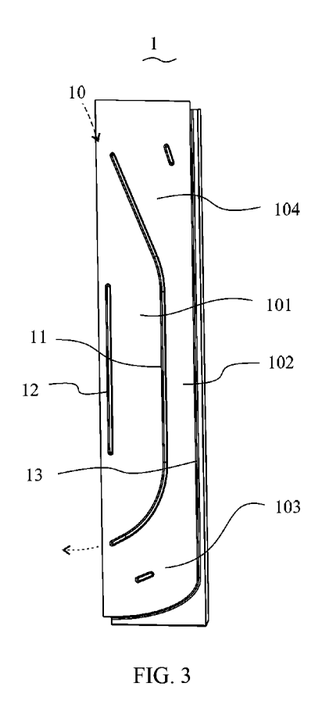
FIG. 3 is a schematic diagram of a first heat exchange sheet of the heat dissipation apparatus in FIG. 2.
Figure 4:
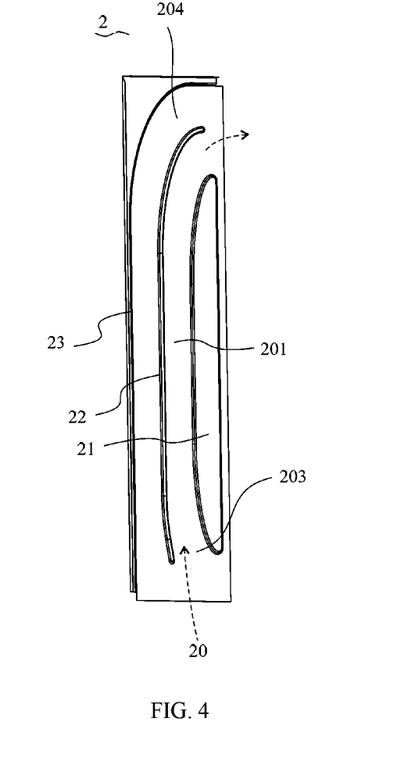
FIG. 4 is a schematic diagram of a second heat exchange sheet of the heat dissipation apparatus in FIG. 2.

With reference to FIG. 3 to FIG. 5, the first path 10 has a first inlet and a first outlet that are disposed opposite to each other, and the first path 10 includes a first countercurrent channel 101, a guide channel 102, and a first-outlet cross-flow channel 103. Two ends of the first countercurrent channel 101 are respectively connected to the first inlet and the first outlet. The first countercurrent channel 101 and the guide channel 102 are disposed side by side, and the first countercurrent channel 101 and the guide channel 102 are isolated from each other by using a protruding isolation rib 11. One end of the guide channel 102 is connected to the first inlet, and the other end is connected to the first outlet by using the first-outlet cross-flow channel 103.

The second path 20 has a second inlet and a second outlet that are disposed opposite to each other, and the second path 20 includes a second countercurrent channel 201 and a second-inlet cross-flow channel 203. One end of the second countercurrent channel 201 is connected to the second outlet, and the other end is connected to the second inlet by using the second-inlet cross-flow channel 203. The first countercurrent channel 101 and the second countercurrent channel 201 are disposed opposite to each other, and the first countercurrent channel 101 and the second countercurrent channel 201 are parallel to each other, so that flow directions of the first fluid and the second fluid are opposite to each other, and countercurrent heat exchange is performed. The first-outlet cross-flow channel 103 and the second-inlet cross-flow channel 203 are disposed opposite to each other, and an extension direction of the first-outlet cross-flow channel 103 and that of the second-inlet cross-flow channel 203 intersect, so that the flow directions of the first fluid and the second fluid intersect, and cross-flow heat exchange is performed. The second countercurrent channel 201 is connected to an inlet of the second path 20 by using the second-inlet cross-flow channel 203. An isolation structure 21 is disposed between the second path 20 and a spatial region that is on the other side of the heat exchange sheets 1, 2, and 3 and is disposed opposite to the guide channel 102, so that the second fluid in the second path 20 does not pass the spatial region.

The first fluid that enters the first path 10 may be divided into two parts. One part enters the first countercurrent channel 101, and mainly performs countercurrent heat exchange with the second fluid in the second countercurrent channel 201. The other part enters the guide channel 102. Because the second path 20 and the spatial region that is on the other side of the heat exchange sheet 1 and is opposite to the guide channel 102 are isolated from each other by using the isolation structure 21, the second fluid does not pass the spatial region. Therefore, the guide channel 102 mainly has a function of delivering a part of the first fluid, heat exchange caused by the first fluid delivered by the guide channel 102 is relatively slight, the first fluid can basically maintain an original temperature and can be rapidly delivered to the first-outlet cross-flow channel 103 located at an outlet of the first path 10, and perform cross-flow heat exchange with a fluid in the second-inlet cross-flow channel 203 located at the inlet of the second path 20. The fluid in the second-inlet cross-flow channel 203 does not perform heat exchange either, so that a temperature difference between the first fluid in the first-outlet cross-flow channel 103 and the second fluid in the second-inlet cross-flow channel 203 is large. According to Fourier's law, in a case in which a thermal conductivity coefficient remains the same, a larger temperature difference results in a higher heat transfer rate, so that a better heat exchange effect is achieved, and heat exchange efficiency can be improved. The heat dissipation apparatus 100 is capable of performing both countercurrent heat exchange and cross-flow heat exchange, and application of cross-flow heat exchange can achieve more effective heat exchange, thereby improving overall heat exchange efficiency.

In this embodiment, the heat exchange sheets 1, 2, and 3 are strip-shaped, the first countercurrent channel 101, the second countercurrent channel 201, and the guide channel 102 all extend along a length direction of the heat exchange sheets 1, 2, and 3; the first outlet and the first inlet are respectively located at two ends of the heat exchange sheet, and correspondingly, an outlet and an inlet of the second path 20 are respectively located at two ends that are on the other side of the heat exchange sheet, so that a time during which the first fluid and the second fluid pass the heat exchange sheet is increased, and heat exchange is fully performed.

A cross section of the first countercurrent channel 101 is larger than a cross section of the guide channel 102. The adjacent heat exchange sheets 1 and 3 are disposed parallel to each other, so that a surface area that is of the heat exchange sheet 1 and corresponding to the first countercurrent channel 101 is larger than a surface area that is of the heat exchange sheet 1 and corresponding to the guide channel 102, and a surface area that is of the heat exchange sheet 1 and occupied by the guide channel 102 that does not perform heat exchange is reduced, thereby helping heat exchange between the first fluid in the first countercurrent channel 101 and the second fluid in the second countercurrent channel 201. As specifically reflected in FIG. 3, a width of the guide channel 102 is less than a width of the first countercurrent channel 101, the guide channel 102 is a long and narrow region that is close to one edge of the heat exchange sheet 1, and the first countercurrent channel 101 is a strip-shaped region that is wider and close to an opposite edge of the heat exchange sheet 1. The first fluid basically does not perform heat exchange in the guide channel 102, and the width of the guide channel 102 is smaller, so that the first fluid can pass the guide channel with low resistance.

A cross section of the first-outlet cross-flow channel 103 is larger than the cross section of the guide channel 102. The adjacent heat exchange sheets 1, 2, and 3 are disposed parallel to each other, so that a surface area that is of the heat exchange sheet 1 and corresponding to the first-outlet cross-flow channel 103 is larger than the surface area that is of the heat exchange sheet 1 and corresponding to the guide channel 102, thereby helping the first fluid that flows out of the guide channel 102 fully perform cross-flow heat exchange in the first-outlet cross-flow channel 103.

One end of the protruding isolation rib 11 extends to the first outlet to isolate the first-outlet cross-flow channel 103 from the first countercurrent channel 101, and the first countercurrent channel 101 extends to the first outlet. Mutual interference that is between a fluid in the first-outlet cross-flow channel 103 and a fluid in the first countercurrent channel 101 and affects heat dissipation effect is avoid.

The extension direction of the second-inlet cross-flow channel 203 and an extension direction of the second countercurrent channel 201 are the same, and are both in a shape of a straight line; and the first-outlet cross-flow channel 103 extends in a curved shape, to change a flow direction of the first fluid that flows out of the first countercurrent channel 101, so that flow directions of the first fluid in the first-outlet cross-flow channel 103 and the second fluid in the second-inlet cross-flow channel 203 intersect, and cross-flow exchange is performed. Due to a curved shape of the first-outlet cross-flow channel 103, the flow direction of the first fluid changes more smoothly. More specifically, an outlet of the first-outlet cross-flow channel 103 is disposed at one end on a long edge of the heat exchange sheet 1, so that the flow direction of the first fluid in the first countercurrent channel 101 is changed from the length direction of the heat exchange sheet 1 to a width direction of the heat exchange sheet 1; and an inlet of the second-inlet cross-flow channel 203 is disposed on a short edge of the heat exchange sheet 2, the extension direction of the second-inlet cross-flow channel 203 and that of the second countercurrent channel 201 are both the length direction of the heat exchange sheet 1, opening directions of the first outlet and the inlet of the second path 20 are perpendicular to each other, and further the extension direction of the first-outlet cross-flow channel 103 and that of the second-inlet cross-flow channel 203 intersect. Here, as another implementation manner, the first-outlet cross-flow channel 103 and the second-inlet cross-flow channel 203 both extend in a curved shape, opening directions of the outlet of the first-outlet cross-flow channel 103 and the inlet of the second-inlet cross-flow channel 203 are opposite to each other, for example, the outlet of the first-outlet cross-flow channel 103 is disposed at one end on a long edge of the heat exchange sheet 1, and the inlet of the second-inlet cross-flow channel 203 is disposed at an end on the other long edge of the heat exchange sheet 1, so that the extension direction of the first-outlet cross-flow channel 103 and that of the second-inlet cross-flow channel 203 also intersect, thereby implementing cross-flow heat exchange.

The isolation structure 21 is a protruding block, and the isolation structure 21 fills a spatial region that is on one side of the heat exchange sheet 1 and is disposed opposite to the guide channel 102, so that the second fluid in the second path 20 cannot pass the spatial region, and the spatial region and the second path 20 are isolated from each other. Here, as another implementation manner, the isolation structure 21 is an annular protruding rib, and surrounds the spatial region that is on the other side of the heat exchange sheet 1 and is disposed opposite to the guide channel 102, to isolate the spatial region from the second path 20. In this case, the heat exchange sheet 1 in the spatial region may be pierced, to connect the spatial region to the guide channel 102, so that the first fluid in the guide channel 102 can pass the spatial region, that is, a volume of the guide channel 102 is increased, thereby increasing fluid traffic in the guide channel 102.

A protruding positioning rib 22 is disposed on the second path 20, where the protruding positioning rib 22 is disposed along an extension direction of the second path 20, located in the middle of a cross section of the second path 20, and configured to ensure a distance between the two heat exchange sheets 1 and 3 on two sides of the second path 20, to ensure space of the second path 20 does not deform or shrink.

In this embodiment, the first path 10 further includes a first-inlet cross-flow channel 104, where the first-inlet cross-flow channel 104 connects the guide channel 102 to the first outlet. The second path 20 further includes a second-outlet cross-flow channel 204, where the second-outlet cross-flow channel 204 and the first-inlet cross-flow channel 104 are disposed opposite to each other, and an extension direction of the second-outlet cross-flow channel 204 and that of the first-inlet cross-flow channel 104 intersect, so that the flow directions of the first fluid and the second fluid intersect, and cross-flow heat exchange is performed. The first fluid and the second fluid can perform cross-flow heat exchange again by using the first-inlet cross-flow channel 104 and the second-outlet cross-flow channel 204, thereby further improving heat exchange efficiency. In this embodiment, a fluid in the first-inlet cross-flow channel 104 carries heat in the main body of the cabinet body 200, and performs heat exchange here for the first time, a temperature of the fluid is in a highest state; the second path 20 is a part of the external circulation path, a temperature of a fluid in the second path 20 rises after passing the second-inlet cross-flow channel 203 and the second countercurrent channel 201 and performing heat exchange, but is still lower than a temperature of the fluid in the first-inlet cross-flow channel 104, so that the fluid in the second path 20 can be used again to perform heat exchange, thereby achieving an objective of further improving the heat exchange efficiency.

A cross section of the first-inlet cross-flow channel 104 is larger than the cross section of the guide channel 102, so that the fluid can enter the guide channel 102 and can increase a proportion of the fluid shunted by the guide channel 102, and more fluid can perform heat exchange in the first-outlet cross-flow channel 103.

The first-inlet cross-flow channel 104 extends in a curved shape, the second-outlet cross-flow channel 204 extends in a curved shape, and opening directions of an inlet of the first-inlet cross-flow channel 104 and an outlet of the second-outlet cross-flow channel 204 are opposite to each other, so that flow directions of the fluid in the first-inlet cross-flow channel 104 and the fluid in the second-outlet cross-flow channel 204 intersect, and cross-flow heat exchange is performed. Due to curved shapes of the first-inlet cross-flow channel 104 and the second-outlet cross-flow channel 204, flow directions of the fluids change more smoothly. More specifically, the inlet of the first-inlet cross-flow channel 104 is disposed at an end on a long edge of the heat exchange sheet 1, and the outlet of the second-outlet cross-flow channel 204 is located at an end on the other long edge of the heat exchange sheet 1. Therefore, opening directions of the inlet of the first-inlet cross-flow channel 104 and the outlet of the second-outlet cross-flow channel 204 are opposite to each other.

Figure 2:
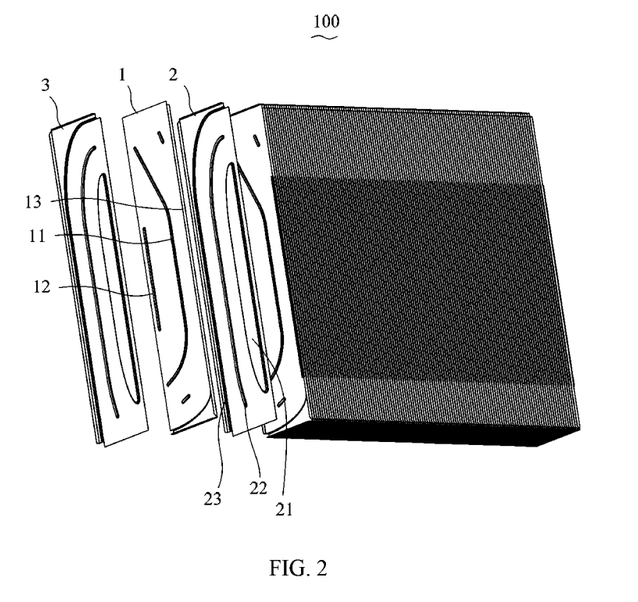
FIG. 2 is a schematic partially exploded view of a heat dissipation apparatus of the cabinet body in FIG. 1.

In this embodiment, with reference to FIG. 2, FIG. 3, and FIG. 4, the multiple heat exchange sheets 1, 2, and 3 are divided into two categories: a first heat exchange sheet 1 and second heat exchange sheets 2 and 3, where the protruding isolation rib 11 is fastened on the first heat exchange sheet 1, the isolation structure 21 is fastened on the second heat exchange sheets 2 and 3, and the protruding isolation rib 11 and the isolation structure 21 are respectively disposed on two sides of the first heat exchange sheet and the second heat exchange sheets. The first heat exchange sheet 1 and the second heat exchange sheets 2 and 3 are alternately arranged, a first path 10 is formed between the first heat exchange sheet 1 and the second heat exchange sheet 3 that is on one side of and adjacent to the first heat exchange sheet 1, and a second path 20 is formed between the first heat exchange sheet 1 and the second heat exchange sheet 2 that is on the other side of and adjacent to the first heat exchange sheet 1, so that at least one first path 10 and at least one second path 20 that are alternately arranged are formed between the multiple heat exchange sheets 1, 2, and 3. The protruding isolation rib 11 and the isolation structure 21 are respectively fastened on the first heat exchange sheet 1 and the second heat exchange sheet 2, which facilitates preparation and processing, and assembly of the protruding isolation rib 11 and the isolation structure 21. The first heat exchange sheet 1 and the second heat exchange sheets 2 and 3 are alternately arranged, so that in this embodiment, the protruding isolation rib 11 and the isolation structure 21 are disposed on two sides of the first heat exchange sheet 1 respectively, that is, disposed on two sides of the second heat exchange sheet 2.

Two first protruding edge ribs 12 and 13 are disposed on the first heat exchange sheet 1, where the two first protruding edge ribs 12 and 13 respectively extend along two edges of the first path 10, to limit a range of the first path 10. A second protruding edge rib 23 is disposed on the second heat exchange sheet 2, where the second protruding edge rib 23 extends along an edge of the second path 20, and the second protruding edge rib 23 and the protruding isolation rib 11 are disposed opposite to each other, so that a range of the second path 20 is limited between the second protruding edge rib 23 and the protruding isolation rib 11. The first protruding edge ribs 12 and 13 and the second protruding edge rib 23 are all located on the edges of the heat exchange sheet, so that heat exchange is performed by fully using a surface area of the heat exchange sheet.

The first heat exchange sheet 1 and the second heat exchange sheet 2 are both sheet metal components, where the protruding isolation rib 11 and the first protruding edge ribs 12 and 13 are formed on the first heat exchange sheet 1 by stamping, and the isolation structure 21, the protruding positioning rib 22, and the second protruding edge rib 23 are formed on the second heat exchange sheet 2 by stamping. More specifically, the isolation structure 21 is a hollow protruding block formed by stamping, which facilitates preparation and processing of the first heat exchange sheet 1 and the second heat exchange sheets 2 and 3.

Here, as another implementation manner, structures of the first heat exchange sheet 1 and the second heat exchange sheets 2 and 3 are the same, and are all, for example, in a shape of a flat plate, and the protruding isolation rib 11, the isolation structure 21, the protruding positioning rib 22, the first protruding edge ribs 12 and 13, and the second protruding edge rib 23 may be independent parts, and clamped between the first heat exchange sheet 1 and the second heat exchange sheets 2 and 3. As still another implementation manner, the multiple heat exchange sheets 1, 2, and 3 are divided into two categories: a third heat exchange sheet and a fourth heat exchange sheet, where the third heat exchange sheet and the fourth heat exchange sheet are alternately arranged, and the protruding isolation rib 11 and the isolation structure 21 are respectively fastened on two sides of the third heat exchange sheet, and may be both formed on the heat exchange sheet by stamping; and the fourth heat exchange sheet is in a shape of a flat plate, a first path is formed between one fourth heat exchange sheet and one side, on which a protruding isolation bar is disposed, of the third heat exchange sheet, and a second path 20 is formed between another fourth heat exchange sheet and one side, on which the isolation structure 21 is disposed, of the third heat exchange sheet. As yet another implementation manner, the heat exchange sheet includes a first heat exchange component and a second heat exchange component, where the first heat exchange component and the second heat exchange component are both sheet-shaped, and the first heat exchange component and the second heat exchange component are fit and thermally coupled to each other; the protruding isolation bar is fastened on one side that is farther from the second heat exchange component and of the first heat exchange component, and the isolation structure is fastened on one side that is farther from the first heat exchange component and of the second heat exchange component; structures of two adjacent heat exchange sheets are symmetrical to each other, and protruding isolation ribs 11 of the two adjacent heat exchange sheets can be fit to each other and form the first path between the two adjacent heat exchange sheets; and isolation structures 21 of another two adjacent heat exchange sheets can be fit to each other and form the second path 20 between the two adjacent heat exchange sheets. Further, the heat dissipation apparatus 100 may include a housing, the multiple heat exchange sheets are located in the housing, and edges of the heat exchange sheets are fit to an internal surface of the housing, so that the ranges of the first path 10 and the second path 20 are limited without disposing the first protruding edge ribs 12 and 13 and the second protruding edge rib 23.

According to the heat dissipation apparatus 100 provided by the first implementation manner of the present invention, a fluid that enters a first path 10 is divided into two parts to perform heat exchange separately. The fluid in a first countercurrent channel 101 performs countercurrent heat exchange. Although traffic is reduced when compared with that of an existing heat dissipation apparatus 100 that has a same volume and performs only countercurrent heat exchange, a heat exchange capacity that is almost the same as that of an existing heat exchange sheet can still be achieved by remaining a flow rate unchanged. Due to a large temperature difference, a first-outlet cross-flow channel 103 located at an outlet of the first path 10 can fully perform cross-flow heat exchange, so that more effective heat exchange is achieved, and an overall heat exchange capacity is improved.

Resistance to the heat dissipation apparatus 100 mainly lies in the heat exchange sheets. In a case in which an air volume remains the same, a part of the fluid does not perform heat exchange in a guide channel 102 and passes rapidly, so that the resistance is reduced. An operating point of a fan is changed, traffic rises, and the heat exchange capacity is enhanced; and with an original limited volume and size of the heat dissipation apparatus 100, the traffic and the heat exchange capacity are improved, and therefore an occupied area is reduced, and product competitiveness is improved. Duo to improvement in the heat exchange capacity, an input air volume may be reduced appropriately, so that noise is less when compared with that of the existing heat dissipation apparatus 100.

Figure 6:
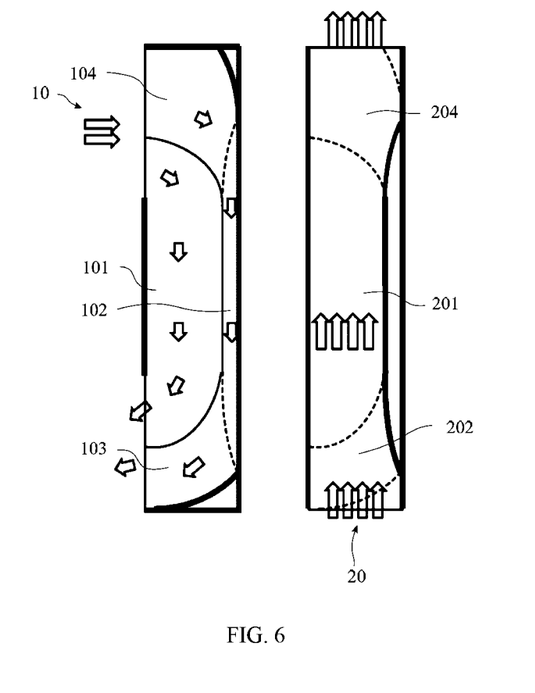
FIG. 6 is a schematic diagram of moving directions of a fluid on two sides of a heat exchange sheet when a heat dissipation apparatus exchanges heat according to a second implementation manner of the present invention.

As shown in FIG. 6, in a second implementation manner provided by the present invention, a difference from the first implementation manner lies in that: the second-outlet cross-flow channel 204 and the second countercurrent channel 201 have a same extension direction, and are both in a shape of a straight line along the length direction of the heat exchange sheets; and the first-inlet cross-flow channel 104 is still in a curved shape, and the extension direction of the first-inlet cross-flow channel 104 is different from the extension direction of the first countercurrent channel 101, so that flow directions of the fluid in the first-inlet cross-flow channel 104 and the fluid in the second-outlet cross-flow channel 204 intersect, and cross-flow heat exchange can also be performed.

Figure 7:
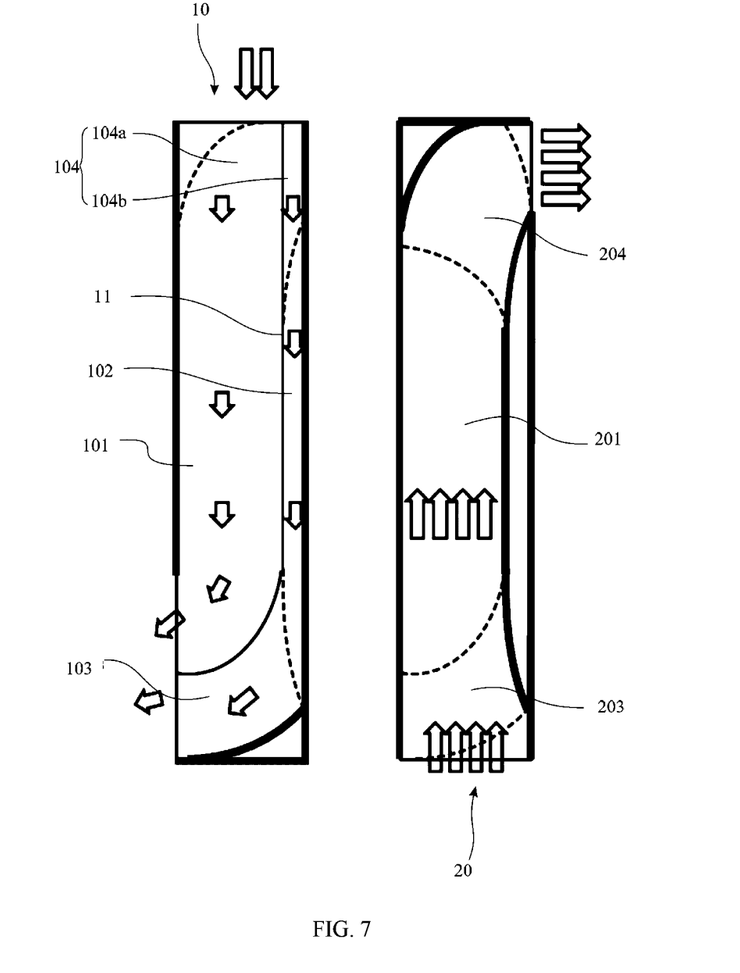
FIG. 7 is a schematic diagram of moving directions of a fluid on two sides of a heat exchange sheet when a heat dissipation apparatus exchanges heat according to a third implementation manner of the present invention.

As shown in FIG. 7, in a third implementation manner provided by the present invention, a difference from the first implementation manner lies in that: the outlet of the second-outlet cross-flow channel 204 faces an edge on one side, on which the isolation structure 21 is disposed, of a heat exchange sheet, and the protruding isolation rib 11 extends to the first inlet, and divides the first-inlet cross-flow channel 104 into two parts: 104*a* and 104*b*, which connect the first countercurrent channel 101 and the guide channel 102 to the first inlet respectively, so that cross-flow heat exchange may be performed separately. Definitely, the protruding isolation rib 11 may not extend to the first inlet, and does not divide the first-inlet cross-flow channel 104, and the first-inlet cross-flow channel 104 is directly connected to the first countercurrent channel 101 and the guide channel 102.

Further, as another implementation manner, the outlet of the second-outlet cross-flow channel 204 faces an edge on one side that is farther from the isolation structure 21 and of the first heat exchange sheet, and the first-inlet cross-flow channel is connected only to the first countercurrent channel 101, so that cross-flow heat exchange is not performed on the fluid that enters a guide area, and a temperature difference between the fluid in the first-outlet cross-flow channel 103 and the fluid in the second-inlet cross-flow channel 203 is further increased, and a heat exchange effect is improved.

As yet another implementation manner, the first countercurrent channel, in a shape of a straight line, directly extends to the first inlet, and the second countercurrent channel, in a shape of a straight line, directly extends to the first outlet, so that the first-inlet cross-flow channel 104 is not formed at the first inlet, and the second-outlet cross-flow channel 204 is not formed at the outlet of the second path 20 either, and the first path 10 and the second path 20 perform cross-flow heat exchange only once.

Finally, it should be noted that the foregoing embodiments are merely intended for describing the technical solutions of the present invention but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present invention.

What is claimed is:

1. A heat dissipation apparatus, comprising multiple heat exchange sheets, wherein the multiple heat exchange sheets are successively arranged at intervals along a thickness direction of the heat exchange sheets, at least one first path and at least one second path are formed between the multiple heat exchange sheets, the at least one first path and the at least one second path are respectively disposed on two sides of the heat exchange sheets, and by using the heat exchange sheets, the at least one first path and the at least one second path are isolated from each other and perform heat exchange; and the first path is configured to accommodate a first fluid, the second path is configured to accommodate a second fluid, and the first fluid and the second fluid are used to transfer heat by flowing; wherein the first path has a first inlet and a first outlet that are disposed opposite to each other, and the first path comprises a first countercurrent channel, a guide channel, and a first-outlet cross-flow channel; two ends of the first countercurrent channel are respectively connected to the first inlet and the first outlet; the first countercurrent channel and the guide channel are disposed side by side, and the first countercurrent channel and the guide channel are isolated from each other by using a protruding isolation rib; and one end of the guide channel is connected to the first inlet, and the other end is connected to the first outlet by using the first-outlet cross-flow channel; and the second path has a second inlet and a second outlet that are disposed opposite to each other, the second path comprises a second countercurrent channel and a second-inlet cross-flow channel, and one end of the second countercurrent channel is connected to the second outlet and the other end is connected to the second inlet by using the second-inlet cross-flow channel; the first countercurrent channel and the second countercurrent channel are disposed opposite to each other, and the first countercurrent channel and the second countercurrent channel are parallel to each other, so that flow directions of the first fluid and the second fluid are opposite to each other, and countercurrent heat exchange is performed; the first-outlet cross-flow channel and the second-inlet cross-flow channel are disposed opposite to each other, and an extension direction of the first-outlet cross-flow channel and that of the second-inlet cross-flow channel intersect, so that the flow directions of the first fluid and the second fluid intersect, and cross-flow heat exchange is performed, and wherein a void space is parallel with the second path and faces and is directly in line with the guide channel, and the void space is configured to exclude fluid, and an isolation structure is disposed between the second path and the void space.

2. The heat dissipation apparatus according to claim 1, wherein, when the number of the at least one first path or the number of the at least one second path is two or more, the number of the at least one first path and the number of the at least one second path are equal or have a difference of one, and the at least one first path and the at least one second path are alternately arranged along an arrangement direction of the multiple heat exchange sheets.

3. The heat dissipation apparatus according to claim 1, wherein a range of a distance between two heat exchange sheets that form the first path is 0.5 mm to 4 mm.

4. The heat dissipation apparatus according to claim 1, wherein a range of a distance between two heat exchange sheets that form the second path is 1 mm to 4 mm.

5. The heat dissipation apparatus according to claim 1, wherein an area of a cross section of the first countercurrent channel is larger than an area of a cross section of the guide channel.

6. The heat dissipation apparatus according to claim 1, wherein an area of a cross section of the first-outlet cross-flow channel is larger than an area of a cross section of the guide channel.

7. The heat dissipation apparatus according to claim 1, wherein one end of the protruding isolation rib extends to an outlet of the first path to isolate the first-outlet cross-flow channel from the first countercurrent channel; and the first countercurrent channel extends to an outlet of the first path.

8. The heat dissipation apparatus according to claim 1, wherein the extension direction of the second-inlet cross-flow channel and an extension direction of the second countercurrent channel are the same, and are both in a shape of a straight line; and the first-outlet cross-flow channel extends in a curved shape.

9. The heat dissipation apparatus according to claim 1, wherein the isolation structure is a protruding block, and the isolation structure fills the spatial region that is on the other side of the heat exchange sheet and is disposed opposite to the guide channel.

10. The heat dissipation apparatus according to claim 1, wherein the first path further comprises a first-inlet cross-flow channel, and at least one of the guide channel and the first countercurrent channel is connected to the first inlet by using the first-inlet cross-flow channel; and the second path further comprises a second-outlet cross-flow channel, the second countercurrent channel is connected to the second outlet by using the second-outlet cross-flow channel; and the second-outlet cross-flow channel and the first-inlet cross-flow channel are disposed opposite to each other, and an extension direction of the second-outlet cross-flow channel and that of the first-inlet cross-flow channel intersect, so that the flow directions of the first fluid and the second fluid intersect, and cross-flow heat exchange is performed.

11. The heat dissipation apparatus according to claim 10, wherein an area of a cross section of the first-inlet cross-flow channel is larger than an area of the cross section of the guide channel.

12. The heat dissipation apparatus according to claim 10, wherein the first-inlet cross-flow channel extends in a curved shape, the second-outlet cross-flow channel extends in a curved shape, and opening directions of an inlet of the first-inlet cross-flow channel and an outlet of the second-outlet cross-flow channel are opposite to each other.

13. The heat dissipation apparatus according to claim 10, wherein the first-inlet cross-flow channel extends in a curved shape, and the extension direction of the second-outlet cross-flow channel and that of the second countercurrent channel are the same, and are both in a shape of a straight line.

14. The heat dissipation apparatus according to claim 1, wherein one of the following situations occurs:
   (a) the protruding isolation rib and the isolation structure are independent parts, and are clamped between the first heat exchange sheet and the second heat exchange sheet;
   (b) the multiple heat exchange sheets are divided into two categories: a third heat exchange sheet and a fourth heat exchange sheet; the third heat exchange sheet and the fourth heat exchange sheet are alternately arranged, and the protruding isolation rib and the isolation structure are respectively fastened on two sides of the third heat exchange sheet; the fourth heat exchange sheet is in a shape of a flat plate; the first path is formed between one fourth heat exchange sheet and one side, on which a protruding isolation bar is disposed, of the third heat exchange sheet; and the second path is formed between another fourth heat exchange sheet and one side, on which the isolation structure is disposed, of the third heat exchange sheet; and
   (c) the heat exchange sheet comprises a first heat exchange component and a second heat exchange component, the first heat exchange component and the second heat exchange component are both sheet-shaped, and the first heat exchange component and the second heat exchange component are fit and thermally coupled to each other; the protruding isolation bar is fastened on one side that is farther from the second heat exchange component and of the first heat exchange component, and the isolation structure is fastened on one side that is farther from the first heat exchange component and of the second heat exchange component; and structures of two adjacent heat exchange sheets are symmetrical to each other, protruding isolation ribs of the two adjacent heat exchange sheets can be fit to each other, and form the first path between the two adjacent heat exchange sheets; and isolation structures of another two adjacent heat exchange sheets can be fit to each other, and form the second path between the two adjacent heat exchange sheets.

15. The heat dissipation apparatus according to claim 1, wherein the first fluid is a liquid or a gas; and the second fluid is a liquid or a gas.

16. The heat dissipation apparatus according to claim 1, wherein a heat exchange sheet is a sheet metal component, and the protruding isolation rib and a first protruding edge rib are formed on the heat exchange sheet by stamping.

17. The heat dissipation apparatus according to claim 1, wherein the first-outlet cross-flow channel and the second-inlet cross-flow channel both extend in a curved shape, and opening directions of an outlet of the first-outlet cross-flow channel and an inlet of the second-inlet cross-flow channel are opposite to each other.

18. The heat dissipation apparatus according to claim 1, wherein the isolation structure is an annular protruding rib, and surrounds the spatial region that is on the other side of the heat exchange sheet and is disposed opposite to the guide channel.

19. The heat dissipation apparatus according to claim 1, wherein the multiple heat exchange sheets are divided into two categories: a first heat exchange sheet and a second heat exchange sheet; the protruding isolation rib is fastened on the first heat exchange sheet, the isolation structure is fastened on the second heat exchange sheet, and the protruding isolation rib and the isolation structure are respectively disposed on two sides of the first heat exchange sheet and the second heat exchange sheet; the first heat exchange sheet and the second heat exchange sheet are alternately arranged; and the first path is formed between the first heat exchange sheet and the second heat exchange sheet that is on one side of and adjacent to the first heat exchange sheet, and the second path is formed between the first heat exchange sheet and the second heat exchange sheet that is on the other side of and adjacent to the first heat exchange sheet.

20. A cabinet body, wherein the cabinet body comprises a main body and a heat dissipation apparatus; and the heat dissipation apparatus is mounted on the main body of the cabinet body, and is configured to perform heat dissipation on elements inside the cabinet body; wherein the heat dissipation apparatus comprise multiple heat exchange sheets, wherein the multiple heat exchange sheets are successively arranged at intervals along a thickness direction of the heat exchange sheets, at least one first path and at least one second path are formed between the multiple heat exchange sheets, the at least one first path and the at least one second path are respectively disposed on two sides of the heat exchange sheets, and by using the heat exchange sheets, the at least one first path and the at least one second path are isolated from each other and perform heat exchange; and the first path is configured to accommodate a first fluid, the second path is configured to accommodate a second fluid, and the first fluid and the second fluid are used to transfer heat by flowing; wherein
   the first path has a first inlet and a first outlet that are disposed opposite to each other, and the first path comprises a first countercurrent channel, a guide channel, and a first-outlet cross-flow channel; two ends of the first countercurrent channel are respectively connected to the first inlet and the first outlet; the first countercurrent channel and the guide channel are disposed side by side, and the first countercurrent channel and the guide channel are isolated from each other by using a protruding isolation rib; and one end of the guide channel is connected to the first inlet, and the other end is connected to the first outlet by using the first-outlet cross-flow channel; and
   the second path has a second inlet and a second outlet that are disposed opposite to each other, the second path comprises a second countercurrent channel and a second-inlet cross-flow channel, and one end of the second countercurrent channel is connected to the second outlet and the other end is connected to the second inlet by using the second-inlet cross-flow channel; the first countercurrent channel and the second countercurrent channel are disposed opposite to each other, and the first countercurrent channel and the second countercurrent channel are parallel to each other, so that flow directions of the first fluid and the second fluid are opposite to each other, and countercurrent heat exchange is performed; the first-outlet cross-flow channel and the second-inlet cross-flow channel are disposed opposite to each other, and an extension direction of the first-outlet cross-flow channel and that of the second-inlet cross-flow channel intersect, so that the flow directions of the first fluid and the second fluid intersect, and cross-flow heat exchange is performed, and wherein a void space is parallel with the second path and faces and is directly in line with the guide channel, and the void space is configured to exclude fluid, and an isolation structure is disposed between the second path and the void space, wherein the first path of the heat dissipation apparatus and an interior of the cabinet body are connected to form an internal circulation path, so that heat inside the cabinet body is transferred to heat exchange sheets of the heat dissipation apparatus; and correspondingly, the second path of the heat dissipation apparatus and an exterior of the cabinet body are connected to form an external circulation path, so that the heat on the heat exchange sheets is transferred out of the cabinet body; or the second path of the heat dissipation apparatus and an interior of the cabinet body are connected to form an internal circulation path, so that heat inside the cabinet body is transferred to heat exchange sheets of the heat dissipation apparatus; and correspondingly, a first path of the heat dissipation apparatus and an exterior of the cabinet body are connected to form an external circulation path, so that the heat on the heat exchange sheets is transferred out of the cabinet body.

\* \* \* \* \*